(12) United States Patent
Sadakata et al.

(10) Patent No.: US 7,174,489 B2
(45) Date of Patent: Feb. 6, 2007

(54) SEMICONDUCTOR MEMORY TEST DEVICE

(75) Inventors: Hiroyuki Sadakata, Takatsuki (JP);
Koichiro Nomura, Ibaraki (JP); Shoji Sakamoto, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 256 days.

(21) Appl. No.: 10/886,672

(22) Filed: Jul. 9, 2004

(65) Prior Publication Data

US 2005/0007172 A1     Jan. 13, 2005

(30) Foreign Application Priority Data

Jul. 10, 2003    (JP)   ............... 2003-272864

(51) Int. Cl.
*G11C 29/00* (2006.01)
*G11C 7/00* (2006.01)

(52) U.S. Cl. ..................... 714/719; 365/201
(58) Field of Classification Search ........ 714/718–723; 365/200–201
See application file for complete search history.

(56) References Cited

U.S. PATENT DOCUMENTS

| | | | | |
|---|---|---|---|---|
| 6,834,361 | B2 * | 12/2004 | Abbott ............... | 714/42 |
| 6,981,191 | B2 * | 12/2005 | Dorsey ............... | 714/733 |
| 6,996,760 | B2 * | 2/2006 | Dorsey ............... | 714/733 |
| 2003/0074617 | A1 | 4/2003 | Dorsey ............... | 714/733 |
| 2003/0074618 | A1 * | 4/2003 | Dorsey ............... | 714/733 |
| 2003/0074619 | A1 * | 4/2003 | Dorsey ............... | 714/733 |
| 2003/0074620 | A1 * | 4/2003 | Dorsey ............... | 714/733 |

FOREIGN PATENT DOCUMENTS

| | | | |
|---|---|---|---|
| JP | 4296676 | | 10/1992 |
| JP | 5196700 | | 8/1993 |
| JP | 2000163992 | A * | 11/1998 |
| JP | 117800 | | 1/1999 |
| JP | 2003121508 | | 4/2003 |

OTHER PUBLICATIONS

Japanese Office Action dated Oct. 18, 2005, with English translation.

* cited by examiner

*Primary Examiner*—Cynthia Britt
(74) *Attorney, Agent, or Firm*—Stevens, Davis, Miller & Mosher, LLP

(57) ABSTRACT

Conventionally, when a burn-in test is performed by means of utilizing a memory BIST circuit, a control of a reset operation for the memory BIST circuit is required from an external source. According to the present invention, it is configured that the memory BIST circuit is used for the burn-in test of a memory macro, and a BIST reset control circuit detects a memory BIST test completion signal from the memory BIST circuit, and automatically resets the memory BIST circuit. Thereby, repetitive continuous tests to the memory macro by the memory BIST circuit can be achieved, and the burn-in test by means of utilizing the memory BIST circuit can be performed.

3 Claims, 8 Drawing Sheets

Fig. 6

Compression logic for compressing output data with 4-bit width to output data with 2-bit width

| EDOUT(3) | EDOUT(2) | EDOUT(1) | EDOUT(0) | DOUT(1) | DOUT(0) |
|---|---|---|---|---|---|
| 0 | 0 | 0 | 0 | 0 | 0 |
| 0 | 0 | 0 | 1 | 0 | 1 |
| 0 | 0 | 1 | 0 | 0 | 1 |
| 0 | 0 | 1 | 1 | 0 | 1 |
| 0 | 1 | 0 | 0 | 0 | 1 |
| 0 | 1 | 0 | 1 | 0 | 1 |
| 0 | 1 | 1 | 0 | 0 | 1 |
| 0 | 1 | 1 | 1 | 0 | 1 |
| 1 | 0 | 0 | 0 | 1 | 0 |
| 1 | 0 | 0 | 1 | 1 | 0 |
| 1 | 0 | 1 | 0 | 1 | 0 |
| 1 | 0 | 1 | 1 | 1 | 0 |
| 1 | 1 | 0 | 0 | 1 | 0 |
| 1 | 1 | 0 | 1 | 1 | 0 |
| 1 | 1 | 1 | 0 | 1 | 0 |
| 1 | 1 | 1 | 1 | 1 | 1 |

⇩ expected value ALL "0" (first row)

When expected value of input output data is ALL "0" or ALL "1", fail data is outputted.

⇩ expected value ALL "1" (last row)

SEMICONDUCTOR MEMORY TEST DEVICE

BACKGROUND OF THE INVENTION

1. Field of the Invention

The present invention relates to a semiconductor integrated circuit device capable of performing a burn-in test of a memory using a memory self-test circuit.

2. Description of the Related Art

Conventionally, in a burn-in test of a memory with an embedded system LSI, in order to achieve a burn-in test of both of the memory and a logic circuit at the same time and cope with limitation of the controllable number of terminals in a jig used for burn-in, measures for reducing the number of terminals used for memory control have been made.

For example, as disclosed in Japanese Patent Publication Laid-Open No. 11-260096 (Reference No. 1), test data, an address, and a memory control signal required for a test of the memory are generated using a frequency dividing output signal of an address generation circuit which is a frequency divider of an external clock, and a pass/fail signal of a test result is produced as a pass/fail judgment flag signal, thereby enabling a test of a memory macro with two pins of the combined use of an input pin and an output pin, and enabling a simultaneous test of a memory section and a logic circuit section at the time of a burn-in test.

However, in a burn-in test of the memory circuit disclosed in the above Reference No. 1, a generation circuit for generating test data, an address signal, and a memory control signal required inside the memory as a test circuit, and a pass/fail signal judgment circuit of the test result are required, so that it has a technical problem that a circuit area of a memory section increases due to a test circuit section which is not directly related to an actual operation of the memory.

In the meanwhile, with an improvement in speed of a memory section and an increase in the number of memory macros mounted in one chip in recent years, a request for implementation of an at-speed test, a reduction in the number of external terminals, or the like has been increased. Therefore, in order to satisfy the request described above, a system LSI which mounts a functional circuit (memory BIST (Built In Self Test) circuit) for performing a self-test of the memory in a chip has been increased.

Generally, as the operation of the memory BIST circuit, the memory section is tested with a certain specific test pattern, and a pass/fail signal of the test result is produced after the test is completed, so that a pass/fail judgment of the memory is performed.

As a problem that this memory BIST circuit is applied to the burn-in test of the memory, the test pattern of the memory section during the burn-in is included. It is necessary to continuously provide the test pattern for the memory section during the burn-in test of the memory. However, since the memory BIST circuit stops the test to the memory section after the test is completed, it is necessary to reset the memory BIST circuit and restart the test. Specifically, it has had a technical problem that a control of a reset operation from the outside has been needed whenever the memory BIST test has been completed, and a technical problem that external terminals for reset control have increased in number in the burn-in test of the memory.

SUMMARY OF THE INVENTION

The object of the present invention is to provide a semiconductor integrated circuit device capable of reducing the number of circuits for burn-in test inside a memory (memory macro), and achieving a reduction in a chip area by means of utilizing a memory BIST circuit, and enabling implementation of a burn-in test without a control of a reset operation from the external source.

A semiconductor integrated circuit device of a first invention comprises: a memory section; a memory self-test circuit for testing the memory section; and a reset circuit for resetting the memory self-test circuit, wherein the memory self-test circuit comprises: an address generation circuit for generating an address of the memory section; a data pattern generation circuit for generating a data pattern written in the memory section; a control signal generation circuit which generates a memory control signal for controlling a data writing operation of the data pattern to the memory section and a data reading operation of data from the memory section corresponding to an address that the address generation circuit generates; a pass/fail judgment circuit which compares expected value data corresponding to a data pattern which is generated in the data pattern generation circuit and is written in the memory section with output data read from the memory section after writing the data pattern in the memory section to judge a pass/fail of the memory section as a non-defective unit when they are coincident or a defective unit when they are not coincident; and a test completion judgment circuit for judging completion of the memory test, wherein the reset circuit reset the memory self-test circuit in response to a completion judgment of a memory test by the test completion judgment circuit.

According to this configuration, during the burn-in test, the reset circuit resets the memory self-test circuit in response to a completion judgment of the memory test by the test completion judgment circuit after starting the test of the memory section by the memory self-test circuit, so that the memory self-test circuit restarts the test of the memory section, thereby making it possible to continuously test the memory section without a reset control from the external source. In other words, once the memory self-test circuit is initiated, the test can be continuously performed during a certain period without the control from the external source. Thus, the burn-in test can be realized without the reset control from the external source by means of utilizing the memory self-test circuit, thereby making it possible to reduce the number of circuits for burn-in test inside the memory, and to achieve a reduction in a chip area.

A semiconductor integrated circuit device of a second invention is configured such that, in the semiconductor integrated circuit device of the first invention, the reset circuit may be supplied with an external control signal, validate a reset operation to the memory self-test circuit when the external control signal is at a first level, and invalidate the reset operation when the external control signal is at a second level.

According to this configuration, in addition to the effect of the first invention, during execution of the continuous test of the memory section in the burn-in test, the external control signal is made in the second level, and the reset operation of the memory self-test circuit is invalidated only for an arbitrary period, so that it returns to a normal memory self-test circuit operation such as a test execution of the memory section and a pass/fail judgment for the memory, thereby making it possible to perform the pass/fail judgment of the memory section in the burn-in test. In addition, the external control signal is made in the first level again, and the reset operation of the memory self-test circuit is validated, so that it becomes possible to return to the continuous test operation of the memory section, thereby making it possible to monitor the pass/fail judgment of the memory section for every arbitrary period.

A semiconductor integrated circuit device of a third invention, in the semiconductor integrated circuit device of the first invention, comprises a plurality of memory sections, wherein each of the plurality of memory sections is configured so as to be selected by a memory selection signal to operate, and wherein the memory selection signal is generated according to an arbitrary address which the address generation circuit in the memory self-test circuit generates.

According to this configuration, in addition to the effect of the first invention, in a system LSI in which the plurality of memory sections are mounted, the memory selection signal is assigned to a signal which is obtained by decoding a certain arbitrary memory address of the address generation circuit in, for example the memory self-test circuit, so that the address generation circuit can be shared with each memory section. Therefore, it is not necessary to prepare the address generation circuit in the memory self-test circuit for every memory section, thereby making it possible to contribute to a reduction in a chip area.

A semiconductor integrated circuit device of a fourth invention is configured such that, in the semiconductor integrated circuit device of the third invention, each of the memory sections may share an output data line of the memory section electrically connected to the pass/fail judgment circuit of the memory self-test circuit.

According to this configuration, in addition to the effect of the third invention, in the system LSI in which the plurality of memory sections are mounted, each of the memory sections shares the output data line (output data bus) of the memory section connected to the pass/fail judgment circuit of the memory self-test circuit, thereby making it possible to share the pass/fail judgment circuit in the memory self-test circuit. Therefore, it is not necessary to prepare the pass/fail judgment circuit for every memory section, thereby making it possible to contribute to a reduction in a chip area.

A semiconductor integrated circuit device of a fifth invention in the semiconductor integrated circuit device of the third invention, wherein the plurality of memory sections comprise at least one first memory section with input/output data bit width of a minimum n-bit width (n is a positive integer), and at least one second memory section with a bit width larger than an n-bit width, and wherein a bit width of an output section of a data pattern of the data pattern generation circuit of the memory self-test circuit and a bit width of an input section of output data read from the memory section of the pass/fail judgment circuit are an n-bit width; comprises a data width expansion circuit which converts data of n-bit width produced from the data pattern generation circuit into data of input/output data bit width of the second memory section to output to the second memory section, and a data width reduction circuit which converts data produced from the second memory section into data of n-bit width of an input section of the pass/fail judgment circuit to output to the pass/fail judgment circuit According to this configuration, in addition to the effect of the third invention, when the input/output data bit width of each memory section is different, the bit width of the output section of the data pattern generation circuit of the memory self-test circuit and the input section of the pass/fail judgment circuit are adjusted to the minimum data bit width n in number, and the data width expansion circuit and the data width reduction circuit for adjusting data width are provided between the memory self-test circuit and the memory sections with the input/output data bit width larger than n-bit width, thereby making it possible for the data pattern generation circuit and the pass/fail judgment circuit of the memory self-test circuit to be sharable for the plurality of memory sections. Therefore, it is not necessary to prepare the data pattern generation circuit and the pass/fail judgment circuit for every memory section, thereby making it possible to contribute to a reduction in a chip area.

A semiconductor integrated circuit device of a sixth invention, in the semiconductor integrated circuit device of the first invention, comprises: a plurality of blocks consisting of the memory section, the memory self-test circuit corresponding thereto, and the reset circuit; and an all memory test completion detection circuit for producing a detection signal when a completion judgment of the memory test by the test completion judgment circuits of all memory self-test circuits is performed, wherein each reset circuit resets the corresponding memory self-test circuit in response to a detection signal of the all memory test completion detection circuit.

According to this configuration, in addition to the effect of the first invention, in the system LSI in which the plurality of memory macros are mounted, the reset of each memory self-test circuit is not performed until the tests by all memory self-test circuits are completed. Therefore, since dynamic stresses to memory cells becomes the same among respective memory sections, a burn-in test can be performed without the necessity of changing a burn-in applying time according to a memory capacity even in a manufacture process where a stress degradation of the memory cell is dominant.

A semiconductor integrated circuit device of a seventh invention, in the semiconductor integrated circuit device of the first invention, comprises: a plurality of blocks consisting of the memory section, the memory self-test circuit corresponding thereto, and the reset circuit; an all memory test completion detection circuit for producing a detection signal when a completion judgment of the memory test by the test completion judgment circuits of all memory self-test circuits is performed, wherein a completion judgment signal of the memory test by the test completion judgment circuit of the memory self-test circuit of the block and a detection signal of the all memory test completion detection circuit are supplied for every block; and a switching circuit which switches and outputs either of them according to an external control signal is provided, wherein each reset circuit resets the corresponding memory self-test circuit in response to a completion judgment signal of the memory test by the test completion judgment circuit outputted from the switching circuit or a detection signal of the all memory test completion detection circuit.

According to this configuration, in addition to the effect of the first invention, in the system LSI in which the plurality of memory macros are mounted, for a reset operation mode of each memory self-test circuit, either of an operation for reset upon completion of the test by all memory self-test circuits or an operation for reset upon completion of the test by each memory self-test circuit irrespective of a completion of the test by other memory self-test circuits is selectable with an external control signal, so that burn-in operation modes can be switched according to major factors of the stress degradation. For example, in a manufacture process where a stress degradation of the memory cell is dominant, in order to make the stress to the memory cells equal among respective memory sections, the operation for reset upon completion of the test by all memory self-test circuits is selected, and when a transistor degradation of the logic section is a major factor, since each memory section is needed to continuously operate, the operation for reset with a completion signal of the test by each memory self-test circuit may be selected.

According to the present invention as mentioned above, the memory self-test circuit is utilized and the burn-in test is implemented without the reset operation control from the external source, thereby making it possible to reduce the number of circuits for burn-in test inside the memory, and to achieve a reduction in a chip area.

BRIEF DESCRIPTION OF THE DRAWINGS

FIG. 6 is a view showing an example of a data compression logic in a data compression circuit in accordance with the third embodiment of the present invention;

DETAILED DESCRIPTION OF THE PREFERRED EMBODIMENTS

Figure 1:
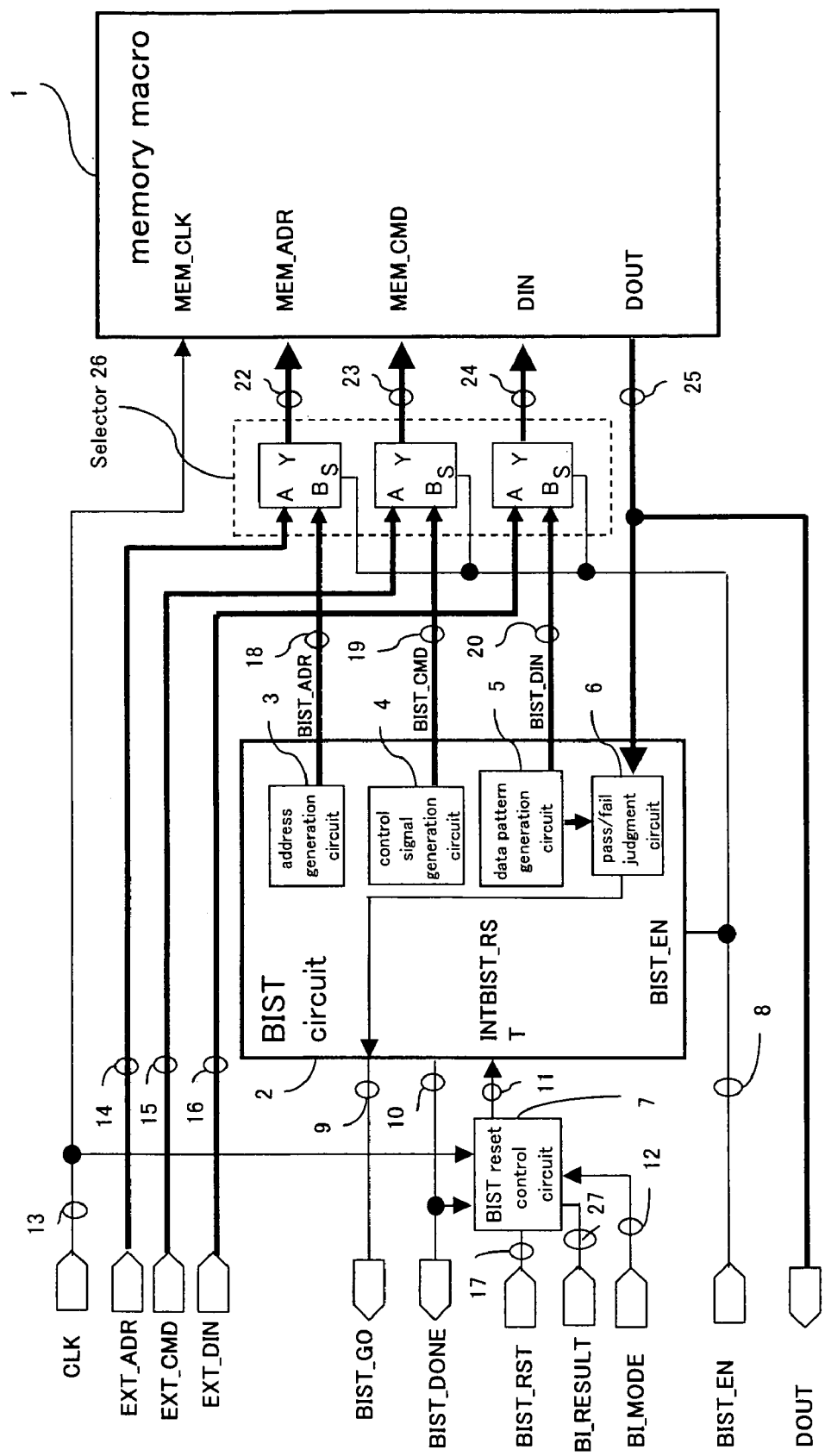
FIG. 1 is a block diagram showing an example of configuring a semiconductor integrated circuit device in accordance with a first embodiment of the present invention.

Referring to the drawings, description will be made of embodiments according to the present invention.

(First Embodiment)

FIG. 1 is a block diagram of a semiconductor integrated circuit device in accordance with a first embodiment of the present invention.

In FIG. 1, reference numeral 1 represents a memory macro, reference numeral 2 represents a memory BIST circuit, reference numeral 3 represents a memory address generation circuit embedded in the memory BIST circuit 2, reference numeral 4 represents a memory control signal generation circuit embedded in the memory BIST circuit 2, reference numeral 5 represents a data pattern generation circuit which is embedded in the memory BIST circuit 2, produces a data pattern written in the memory macro 1, and produces expected value data corresponding to the data pattern, and reference numeral 6 represents a memory pass/fail judgment circuit which is embedded in the memory BIST circuit 2, and performs a pass/fail judgment of the memory macro 1 based on a data comparison between expected value data produced from the data pattern generation circuit 5 and a memory output data signal (DOUT) 25.

Reference numeral 12 represents a burn-in mode enable signal (BI_MODE) for selecting a burn-in test mode; reference numeral 17, an external input BIST reset signal (BIST_RST); reference numeral 7, a BIST reset control circuit; and reference numeral 11, an internal memory BIST reset signal (INTBIST_RST) generated by the BIST reset control circuit 7. The BIST reset control circuit 7 generates the BIST reset signal 11 by the BIST_RST signal 17 when the BI_MODE signal 12 is set to a disenable mode, and automatically generates the BIST reset signal 11 according to a BIST_DONE signal 10 in addition to the control by the BIST_RST signal 17 described above when the BI_MODE signal 12 is set to an enable mode.

Reference numeral 8 represents a BIST enable signal (BIST_EN) which makes the memory BIST circuit 2 in a valid state or an invalid state, reference numeral 9 represents a memory pass/fail judgment signal (BIST_GO) from the pass/fail judgment circuit 6, reference numeral 10 represents a memory BIST test completion signal (BIST_DONE) for showing that a memory BIST test is completed, reference numeral 13 represents a clock signal (CLK), reference numeral 14 represents an external input address signal (EXT_ADR), reference numeral 15 represents an external input control signal (EXT_CMD), reference numeral 16 represents an external input memory data signal (EXT_DIN), reference numeral 18 represents a memory address signal (BIST_ADR) that the memory BIST circuit 2 generates, reference numeral 19 represents a memory control signal (BIST_CMD) that the memory BIST circuit 2 generates, reference numeral 20 represents a memory data signal (BIST_DIN) that the memory BIST circuit 2 generates, reference numeral 22 represents an address signal (MEM_ADR) supplied to the memory macro 1 from a selector 26, reference numeral 23 represents a memory control signal (MEM_CMD) supplied to the memory macro 1 from the selector 26, reference numeral 24 represents a memory input data signal (MEM_DIN) supplied to the memory macro 1 from the selector 26, reference numeral 25 represents a memory output data signal (DOUT), and reference numeral 27 represents a burn-in test result monitor selection signal (BI_RESULT).

When the BIST enable signal (BIST_EN) 8 is in a disenable mode, the selector 26 selects the EXT_ADR signal 14 among the EXT_ADR signal 14 and the BIST_ADR signal 18 to produce as the MEM_ADR signal 22, selects the EXT_CMD signal 15 among the EXT_CMD signal 15 and the BIST_CMD signal 19 to produce as the MEM_CMD signal 23, and selects the EXT_DIN signal 16 among the EXT_DIN signal 16 and the BIST_DIN signal 20 to produce as the MEM_DIN signal 24. Conversely, when the BIST_EN signal 8 is in an enable mode, the selector 26 selects the BIST_ADR signal 18 to produce as the MEM_ADR signal 22, selects the BIST_CMD signal 19 to produce as the MEM_CMD signal 23, and selects the BIST_DIN signal 20 to produce as the MEM_DIN signal 24.

Hereinafter, description will be made of the operation of the semiconductor integrated circuit device configured as above.

In the case of a normal memory macro control operation, the BIST_EN signal 8 is set to a disenable mode at first, so that the memory BIST circuit 2 is set to an invalid state. In addition, the selector 26 selects the EXT_ADR signal 14, the EXT_CMD signal 15, and the EXT_DIN signal 16, respectively, so that the external input signal becomes valid as the control signal of the memory macro 1. In the case of a circuit configuration described above, since the memory BIST circuit 2 is an invalid state, the BI_MODE signal 12 is not to be cared in particular.

Next, in the case of a normal BIST test, the BIST_EN signal 8 is set to an enable mode and the BI_MODE signal 12 is set to a disenable mode. In the case of above settings, the selector 26 selects the BIST_ADR signal 18, the BIST_CMD signal 19, and the BIST_DIN signal 20, respectively, and a BIST circuit generation signal becomes valid as a control signal of the memory macro 1. In addition, the BIST reset control circuit 7 performs a signal transmission of the BIST_RST signal 17 of the external reset signal as it is to the INTBIST_RST signal 11.

In the case of a burn-in test by the memory BIST circuit 2, both of the BIST_EN signal 8 and the BI_MODE signal 12 are set to an enable mode. In the case of above settings, the selector 26 selects the BIST_ADR signal 18, the BIST_CMD signal 19, and the BIST_DIN signal 20 of the BIST circuit generation signal, respectively, for the memory macro 1, so that the BIST circuit generation signal becomes valid as the control signal of the memory macro 1. The BIST reset control circuit 7 also detects the BIST_DONE signal 10 for showing a BIST test completion, and automatically generates the INTBIST_RST signal 11 to reset the memory BIST circuit 2. Moreover, when monitoring the burn-in test of the memory macro 1, a loop operation of the memory BIST circuit 2 can be released by means of validating the BI_RESULT signal 27, so that after verifying a test completion flag by the BIST_DONE signal 10, what is necessary is to monitor the BIST_GO signal 9 and just to perform pass/fail judgment.

Incidentally, in the cases of the normal BIST test and the burn-in test, the operation of the memory BIST circuit 2 itself does not change, but the operation of the BIST reset control circuit 7 changes. In a normal BIST test, the BIST_RST signal 17 of an external reset signal is supplied as the INTBIST_RST signal 11 as it is, so that the memory BIST circuit 2 is initialized, thereby the test is performed. Herein, a test execution pattern is programmed in the memory BIST circuit 2 in advance, and the memory BIST circuit 2 automatically generates the test completion signal (BIST_DONE signal 10 is in an "H" level) after the program is executed. After this, unless the BIST reset signal (INTBIST_RST signal 11) is supplied, the memory BIST circuit 2 keeps a completion state. When in a burn-in test, the BIST reset control circuit 7 detects the test completion signal (BIST_DONE signal 10 is in an "H" level) that the memory BIST circuit 2 automatically generates, performs the BIST reset again, and then makes the BIST test into an endless loop. Incidentally, the memory BIST circuit 2 has a test completion judgment circuit (not shown). The test completion judgment circuit generates a test completion signal (BIST_DONE signal 10 is in an "H" level) after the execution completion of the test pattern which has been internally programmed in advance as described above.

As described above, when in the burn-in test mode, once the memory BIST circuit 2 is initiated, the test can be continuously performed during a certain period without the control from an external source.

Figure 2:
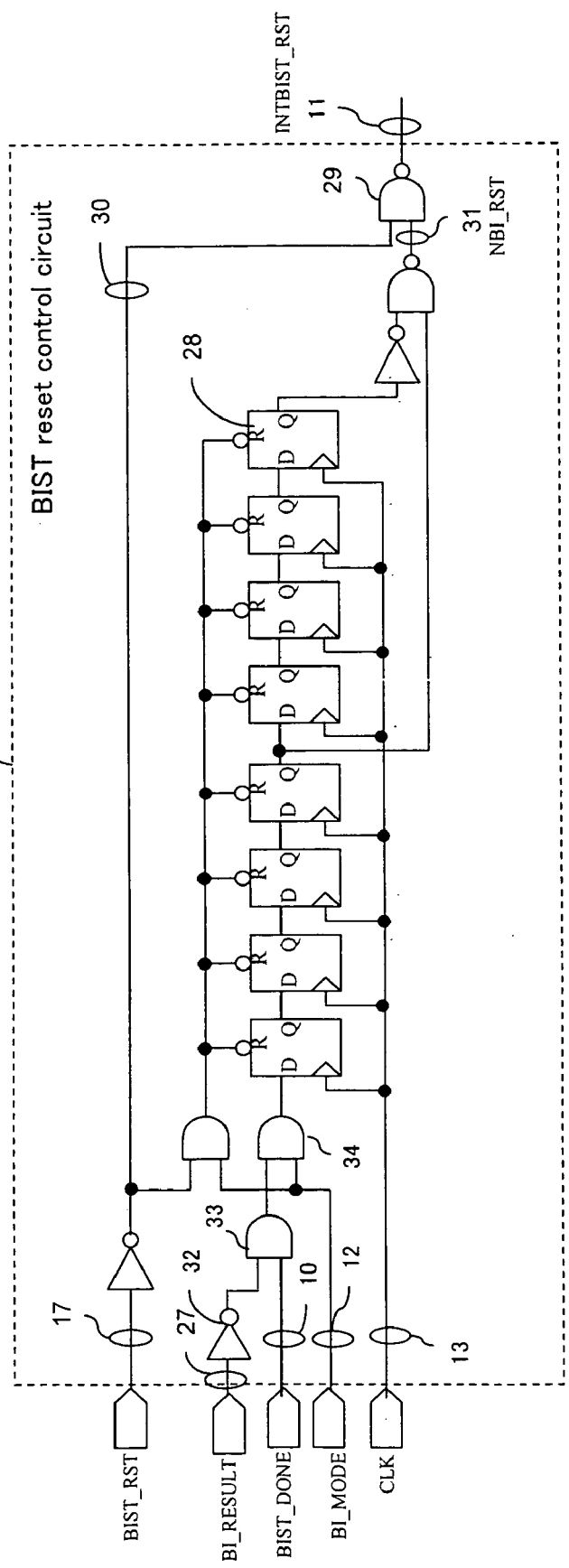
FIG. 2 is a block diagram of a BIST reset control circuit in accordance with the first embodiment of the present invention.

FIG. 2 shows a circuit configuration of the BIST reset control circuit 7, reference numeral 17 represents the BIST_RST signal, reference numeral 10 represents the BIST_DONE signal, reference numeral 12 represents the BI_MODE signal, reference numeral 13 represents the CLK signal, reference numeral 28 represents a D flip-flop (delay Flip-Flop) circuit, and reference numeral 29 represents a 2-input AND circuit which supplies a NBIST_RST signal 30 that is an inversion signal of the BIST_RST and a burn-in mode inverting reset signal (NBI_RST signal) 31, and produces the INTBIST_RST signal 11.

Hereinafter, description will be made of the operation of the BIST reset control circuit 7 configured as above.

In the circuit configuration described above, switching operation modes is performed by the BI_MODE signal 12.

First, when the BI_MODE signal 12 stays in an "L" level (low-level), namely the burn-in mode is set to an invalid mode, since an input signal to the D flip-flop circuit 28 becomes an "L" level, the NBI_RST signal 31 is fixed to an "H" level (high-level). For this reason, the BIST_RST signal 17 is transmitted as the INTBIST_RST signal 11 as it is, so that only the BIST reset by the external control becomes valid.

When the BI_MODE signal 12 stays in an "H" level, namely the burn-in mode is set to a valid mode, although the BIST_DONE signal 10 is in an "L" level during BIST test execution, "H" level data is transmitted to the D flip-flop circuit 28 when the BIST_DONE signal 10 becomes an "H" level in response to the BIST test completion, and the NBI_RST signal 31 becomes an "L" level after four clocks. In addition, in response to the signal, the INTBIST_RST signal 11 becomes an "H" level, and a reset signal of the memory BIST circuit 2 is generated. Herein, the burn-in test result monitor selection signal (BI_RESULT) 27 is in an "L" level. Moreover, the BIST_RST signal 17 is in an "L" level, and the NBIST_RST signal 30 which is the inversion signal thereof and supplied to the AND circuit 29 is an "H" level.

Figure 3:
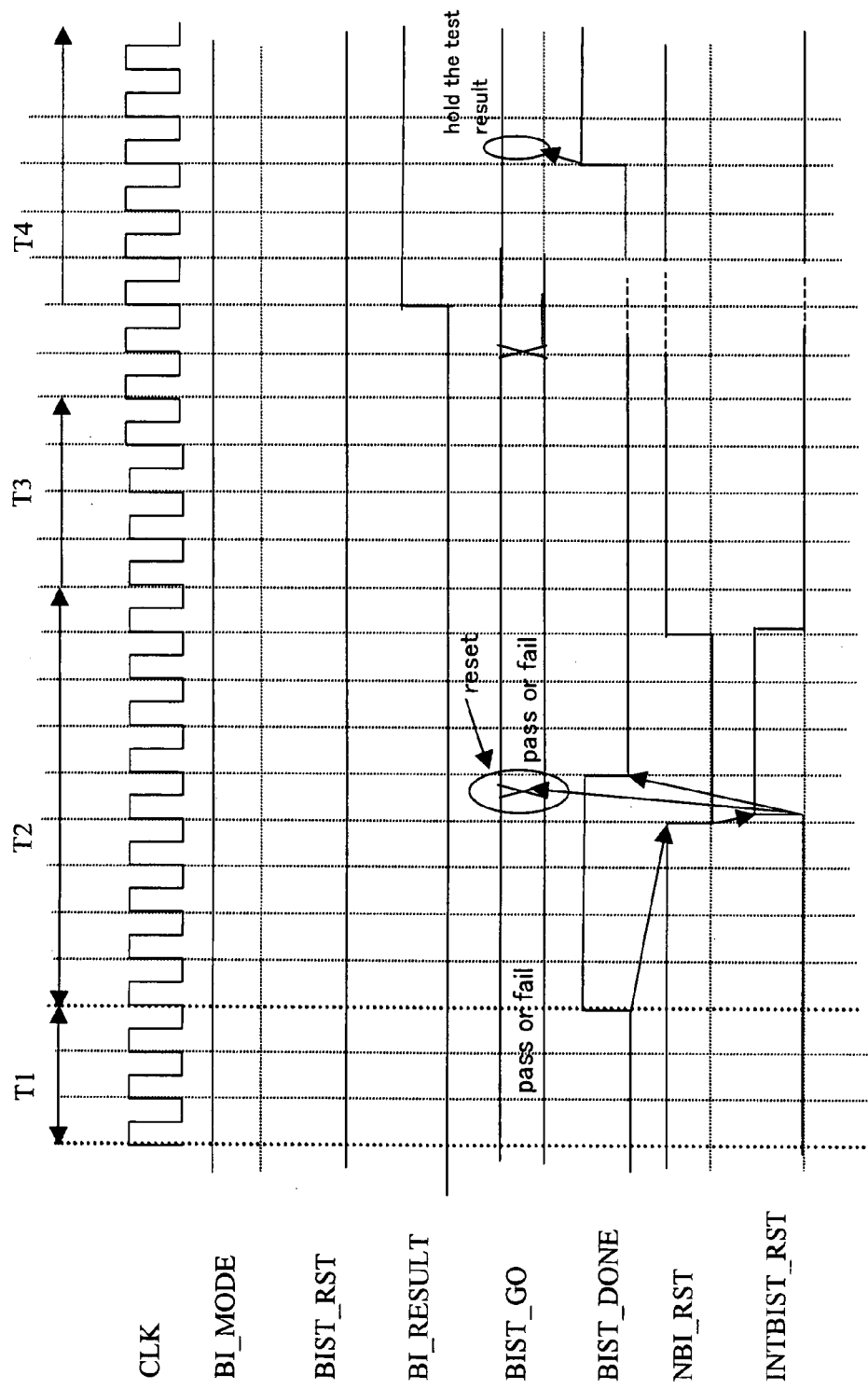
FIG. 3 is a timing chart of a BIST test in accordance with the first embodiment of the present invention.

FIG. 3 is a timing chart when the burn-in mode is set to a valid mode. Reference numeral T1 represents a BIST test execution period, reference numeral T2 represents an automatic BIST reset period, and reference numeral T3 represents a re-BIST test execution period. Reference numeral T4 represents a burn-in test result monitor period.

In the BIST test execution period T1, since the BIST_DONE signal 10 for showing the BIST test completion is in an "L" level, the NBI_RST signal 31 is in an "H" level, the NBIST_RST signal 30 is in an "H" level (BIST_RST signal 17 is in an "L" level), and the INTBIST_RST signal 11 is in an "L" level.

In the automatic BIST reset period T2, when the BIST_DONE signal 10 becomes an "H" level in response to the BIST test completion, the NBI_RST signal 31 becomes an "L" level after four clocks according to the circuit configuration shown in FIG. 2. Further, in response to the signal, the INTBIST_RST signal 11 becomes an "H" level, and a reset signal of the memory BIST circuit 2 is generated. The memory BIST circuit 2 is therefore reset, and the BIST_DONE signal 10 of the BIST test completion signal is also reset to an "L" level. Then, in response to the INTBIST_RST signal 11 becoming in an "L" level, the memory BIST reset operation is released, and the BIST test operation is started again (re-BIST test execution period T3).

In the burn-in test result monitor period T4, the INTBIST_RST signal 11 keeps maintaining an "L" level even when the BIST_DONE signal 10 of the BIST test completion flag becomes an "H" level by making the BI_RESULT signal 27 in an "H" level, so that the memory BIST circuit 2 is not reset, and a loop operation of the memory BIST circuit 2 is released. Therefore, a pass/fail judgment of the memory can be performed by monitoring the BIST_GO signal 9 of the memory pass/fail judgment signal after the BIST_DONE signal 10 of the BIST test completion flag changes to an "H" level.

According to this embodiment, when in the burn-in mode, after the test start of the memory macro 1 by means of the memory BIST circuit 2, the BIST test completion flag is generated (BIST_DONE signal 10 is in an "H" level) in response to the BIST test completion, and the reset of the memory BIST circuit 2 is performed as mentioned above. In order that the memory BIST circuit 2 may start the test of the memory macro 1 again by this reset, it is possible to continuously perform the test of the memory macro 1 without a reset control from the external source. In other words, once the memory BIST circuit 2 is initiated, the burn-in test for continuously performing the test during a certain period by the memory BIST circuit 2 without the reset control from the external source can be achieved. Thus, the burn-in test can be achieved without the reset control from the external source by means of utilizing the memory BIST circuit 2, thereby making it possible to reduce the number of circuits for burn-in test inside the memory, and to achieve a reduction in a chip area.

Moreover, during execution of the continuous test of the memory macro 1 in the burn-in test, the BI_RESULT signal 27 is made in an "H" level and the reset operation of the memory BIST circuit 2 is invalidated by the BIST reset control circuit 7 for only an arbitrary period, so that it returns to a normal memory BIST circuit operation such as the test execution of the memory macro 1 and the pass/fail judgment for the memory, thereby making it possible to perform the pass/fail judgment of the memory macro 1 in the burn-in test. In addition, the BI_RESULT signal 27 is made in an "L" level again, and the reset operation of the memory BIST circuit 2 by the BIST reset control circuit 7 is validated, so that returning to the continuous test operation of the memory macro 1 becomes possible, thereby making it possible to monitor the pass/fail judgment of the memory macro 1 for every arbitrary period.

(Second Embodiment)

Figure 4:
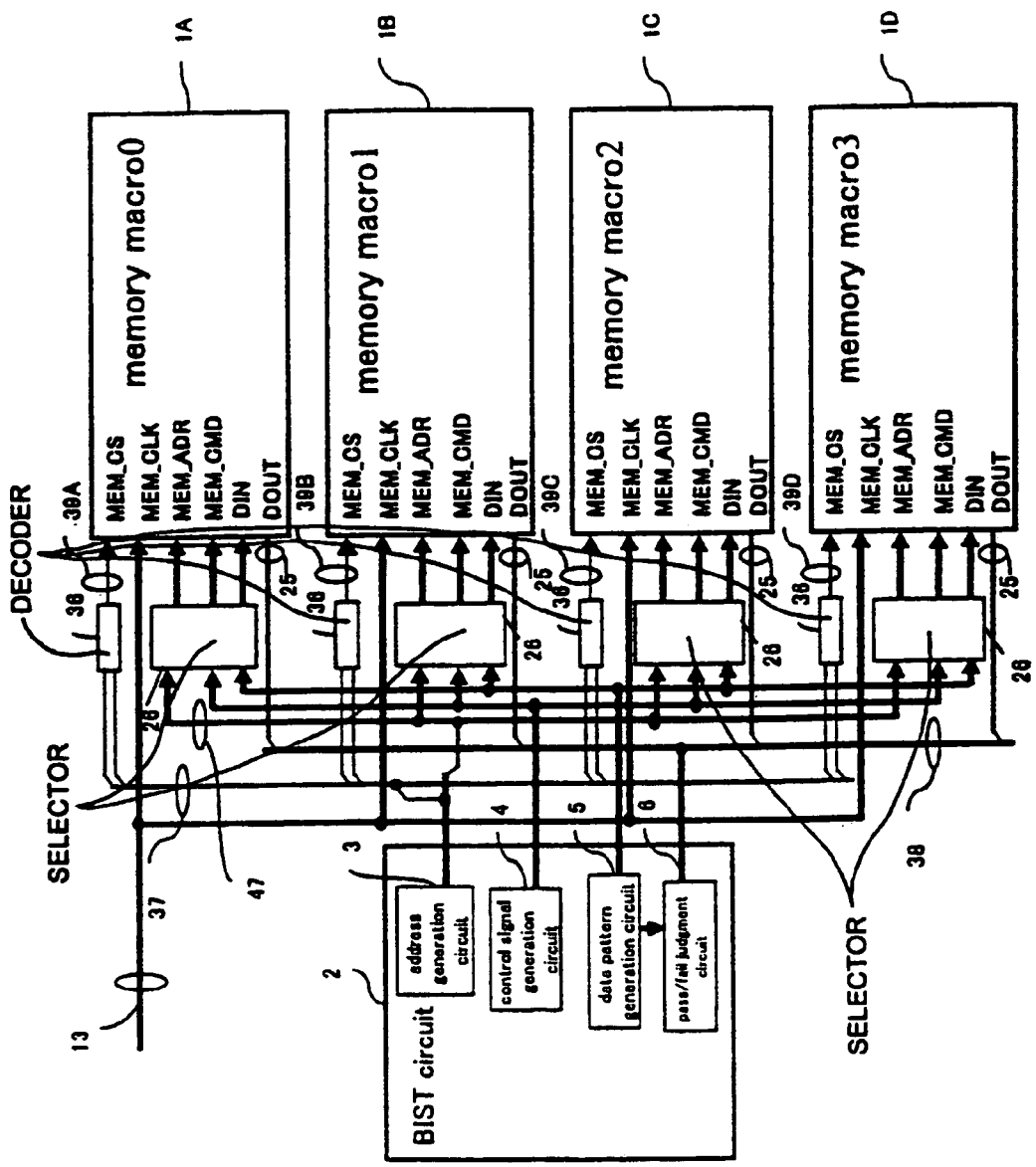
FIG. 4 is a block diagram showing an example of configuring a semiconductor integrated circuit device in accordance with a second embodiment of the present invention.

FIG. 4 is a block diagram of a semiconductor integrated circuit device in accordance with a second embodiment of the present invention. This semiconductor integrated circuit device has a configuration in which a plurality of memory macros (in the drawing, four memory macros are shown) and one memory BIST circuit are mounted. Incidentally, in FIG. 4, the same reference numerals are given to the same components and signal lines as those in FIG. 1 and description thereof will be omitted.

In FIG. 4, reference numerals 1A through 1D represent memory macros with the same address configuration and input/output data bit width, reference numeral 37 represents a signal of two highest-order bits (BIST_ADR [n:n−1] (n is a natural number)) of an address (BIST generation address) that the memory BIST circuit 2 generates, reference numeral 47 represents a signal of the BIST generation address (BIST_ADR [n−2:0]) other than the BIST_ADR [n:n−1] signal 37. Each memory macro has a configuration in which each memory address is controlled by the BIST_ADR [n−2:0] signal 47, reference numeral 36 represents a decode circuit for decoding the BIST_ADR [n:n−1] signal 37, reference numerals 39A through 39D represent memory macro selection signals (MEM_CS signal) for selecting the memory macro with a signal which decodes the BIST_ADR [n:n−1] signal 37 by the decode circuit 36, and a data bus 38 is shareable for an output data signal 25 of each of the memory macros 1A through 1D.

Incidentally, although not shown in FIG. 4, the BIST reset control circuit 7 similar to that shown in FIG. 1 is comprised. Moreover, similar to FIG. 1, the BIST_EN signal 8 and the INTBIST_RST signal 11 from the BIST reset control circuit 7 are supplied to the memory BIST circuit 2, and the BIST_GO signal 9 and the BIST_DONE signal 10 are produced from the memory BIST circuit 2. The same BIST_EN signal 8 is supplied to each selector 26 as a control signal, and external input signals of the EXT_ADR signal (14), the EXT_CMD signal (15), and the EXT_DIN signal (16) according to corresponding each memory macro are supplied other than three output signals from the memory BIST circuit 2 shown as a selected input.

Hereinafter, description will be made of the operation of the semiconductor integrated circuit device configured as above.

When in a normal memory macro control operation, as similar to the first embodiment, the memory BIST circuit 2 is set to an invalid state, and each selector 26 selects an external input signal (not shown) required for each of the memory macros 1A through 1D.

When in a normal BIST test and a burn-in test, as similar to the first embodiment, the memory BIST circuit 2 is set to a valid state, and each selector 26 is controlled so as to select the output (47) of the memory address generation circuit 3, the output of the memory control signal generation circuit 4, or the output of the data pattern generation circuit 5. The BIST_ADR [n:n−1] signal 37 of a high-order address produced from the memory address generation circuit 3 is decoded by the decode circuit 36, and either of the signals of MEM_CS signals 39A through 39D is produced. A memory macro is selected according to the produced MEM_CS signals 39A through 39D. Herein, in the case of BIST_ADR [n:n−1]=00b, for example, MEM_CS signal 39A is produced by the decode circuit 36 (at this time, MEM_CS signal 39A is in an "H" level, and other MEM_CS signals 39B through 39D are in an "L" level, for example). The memory macro 1A is made in a selection state by the MEM_CS signal 39A, and the BIST test is executed only to the memory macro 1A. Herein, that the memory macro 1A becomes in a selection state means the MEM_CS signal 39A becomes an "H" level, and also means that the memory macro 1A considers that a command signal and an address signal are "valid" to thereby transmit the signal to the inside of the macro, and the operation of the memory macro 1A becomes possible. In the meanwhile, the signal transmission to the inside of the macro is interrupted because the command signal and the address signal become "invalid", so that the memory macros 1B through 1D whose MEM_CS signals are in an "L" level do not perform a macro operation. In the normal BIST test and the burn-in test, other settings (controls) to each memory macro are similar to those of the first embodiment.

According to this embodiment, besides obtaining the similar effect to that of the first embodiment, when a plurality of memory macros with the same address configuration and input/output data bit width are mounted, one memory BIST generation circuit 2 is mounted, and an upper address of an output address of the memory address generation circuit 3 is assigned to the MEM_CS signals 39A through 39D which are the memory macro selection signals, so that the memory address generation circuit 3 of the memory BIST circuit 2 can be shareable for respective memory macros. Since the data bus 38 is also shareable for the output data signals of respective memory macros, the memory pass/fail judgment circuit 6 of the memory BIST circuit 2 can be shareable. Further, the control signal generation circuit 4 in the memory BIST circuit 2, the data pattern generation circuit 5, and the test completion judgment circuit which is not shown are also shareable. Therefore, it is not necessary to prepare the memory address generation circuit, the memory pass/fail judgment circuit, or the like for every memory macro, thereby making it possible to contribute to a reduction in a chip area.

(Third Embodiment)

Figure 5:
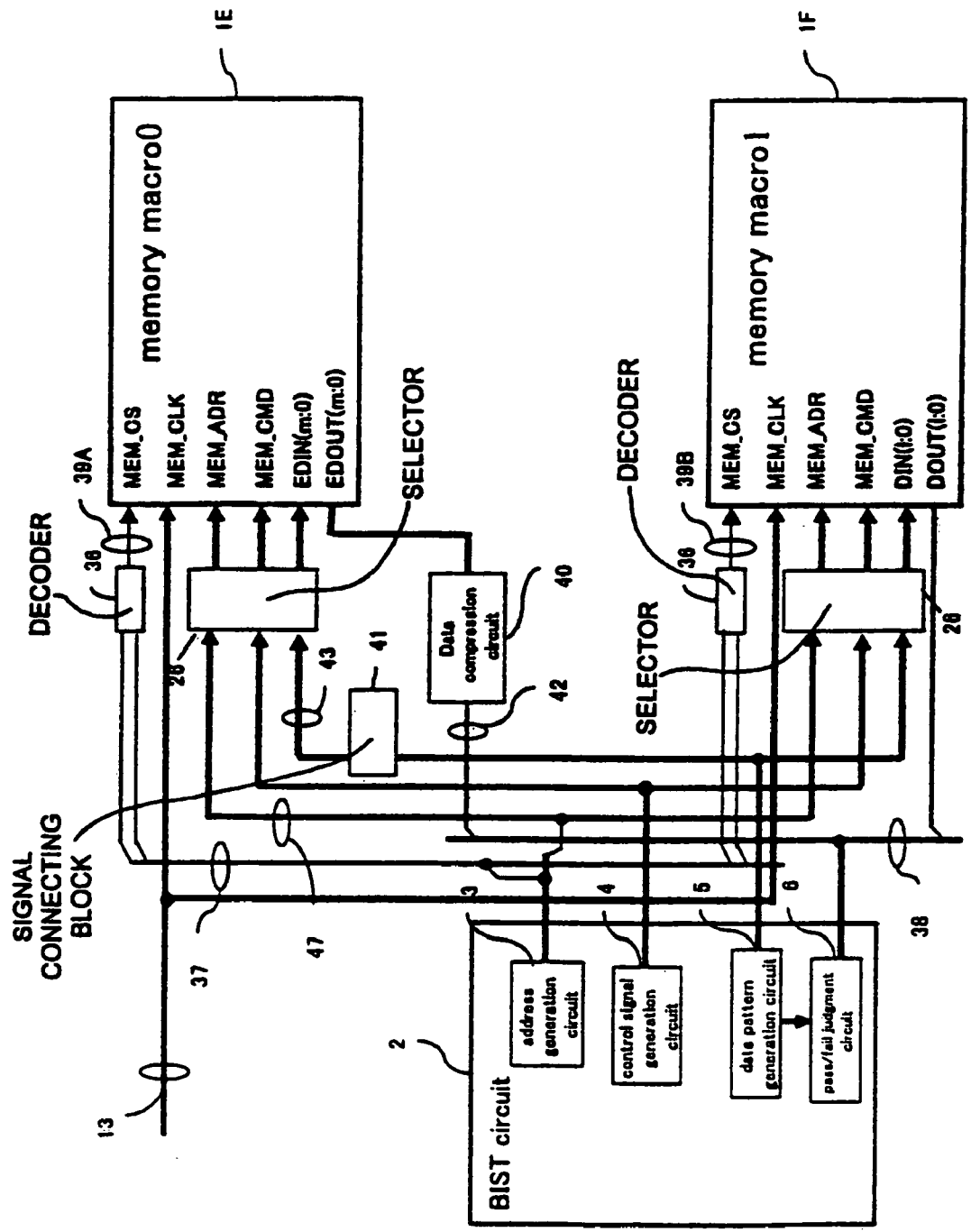
FIG. 5 is a block diagram showing an example of configuring a semiconductor integrated circuit device in accordance with a third embodiment of the present invention.

FIG. 5 is a block diagram of a semiconductor integrated circuit device in accordance with a third embodiment of the present invention. This semiconductor integrated circuit device has a configuration in which a plurality of memory macros (in the drawing, two memory macros are shown) and one memory BIST circuit are mounted. Incidentally, in FIG. 5, the same reference numerals are given to the same components and signal lines as those in FIG. 4 and description thereof will be omitted.

In FIG. 5, reference numeral 1E represents a memory macro having an input data EDIN [m:0] and an output data EDOUT [m:0] with a bit width (m+1), and reference numeral 1F represents a memory macro having an input data DIN [l:0] and an output data DOUT [l:0] with a bit width (l+1) (l<m; l and m are natural numbers). Incidentally, the number of addresses of the memory macro 1E is the same as that of the memory macro 1F.

Reference numeral 40 represents a data compression circuit which performs a data compression of the EDOUT [m:0] signal, which is the output data of the memory macro 1E, to adjust to a data width of the input data DOUT [l:0] of the pass/fail judgment circuit 6 in the memory BIST circuit 2, reference numeral 41 represents a signal connecting block which bundles signal lines so as to adjust the output data DIN [l:0] generated from the data pattern generation circuit 5 in the memory BIST circuit 2 into a data width of the EDIN [m:0] which is the input data of the memory macro 1E, reference numeral 42 represents the DOUT [l:0] signal whose data width is compressed by the data compression circuit 40, and reference numeral 43 represents the EDIN [m:0] signal whose data width is expanded by the signal connecting block 41.

Moreover, the data widths of the data pattern generation circuit 5 and the pass/fail judgment circuit 6 of the memory BIST circuit 2 are set to [l:0].

Hereinafter, description will be made of the operation of the semiconductor integrated circuit device configured as above. Incidentally, in this embodiment, a bit width of the input data and the output data of the memory macro 1E is different from a data width of the data pattern generation circuit 5 and the pass/fail judgment circuit 6 of the memory BIST circuit 2, and for that reason, the configuration of this embodiment is similar to that of the second embodiment except being provided with the data compression circuit 40 and the signal connecting block 41, so that hereinafter, description will be made mainly of the operation of the components different from those of the second embodiment.

A selection of the memory macros 1E and 1F by the memory BIST circuit 2 during testing is performed by an upper address of the address generation circuit 3 of the memory BIST circuit 2 as shown in the second embodiment. Since the input/output data width of the memory macro 1F and the data width of the memory BIST circuit 2 are the same, the data width of memory macro 1F is not needed to be cared in particular. In the meanwhile, the output data from the memory macro 1E is adjusted to the data width, which the pass/fail judgment circuit 6 of the memory BIST circuit 2 manages, by the data compression circuit 40. The input data to the memory macro 1E is also adjusted to the data width [m:0] from the data width [l:0] of the data pattern generation circuit 5 of the memory BIST circuit 2 by the signal connecting block 41.

FIG. 6 shows an example of a data compression logic in the data compression circuit 40, and a logical table when an output data width of 4 bits is compressed to an output data width of 2 bits is shown, here. Herein, it is supposed that each input/output data value is ALL "1" or ALL "0" in the burn-in test of the memory. In other words, as the data expected value, ALL "1" or ALL "0" is "pass", and the data expected value except that becomes "fail". According to this logical table, when outputs except ALL "1" or ALL "0" appear, the compression output data DOUT produces "01" or "10". Therefore, when this compression output data DOUT is compared with the expected value by the memory pass/fail judgment circuit 6 of the memory BIST circuit 2, the result shows "fail", so that test quality is not degraded due to performing data compression under a test condition described above.

Figure 7:
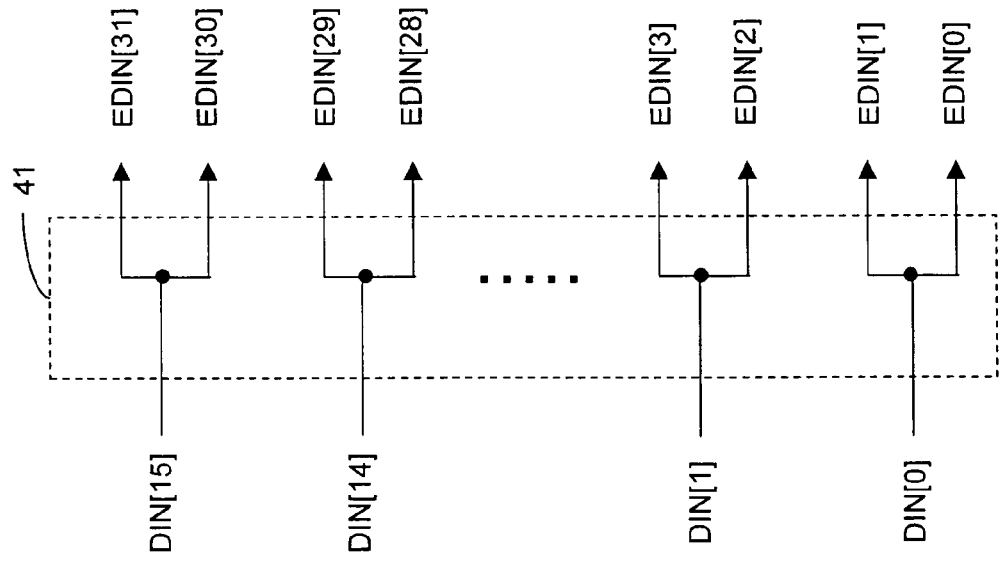
FIG. 7 is a view showing an example of an interconnection of a signal connecting block in accordance with the third embodiment of the present invention.

FIG. 7 shows an example of a signal connection of the signal connecting block 41, and an example where the above-mentioned data width [l:0] is set to [15:0], and data width [m:0] is set to [31:0] is shown here. The DIN [15:0] is the output data signal from the data pattern generation circuit 5 of the memory BIST circuit 2, and the EDIN [31:0] is the input data signal to the memory macro 1E. In addition, the DIN signal and the EDIN signal short-circuit two signal lines of the EDIN signal, and one signal line of the DIN signal is connected thereto. By making the signal connection described above, the expansion of the output data bit width can be achieved.

According to this embodiment, even when the input/output data bit widths of a plurality of memory macros are different, the similar effect to that of the second embodiment can be obtained by arranging the data compression circuit 40 and the signal connecting block 41.

(Forth Embodiment)

Figure 8:
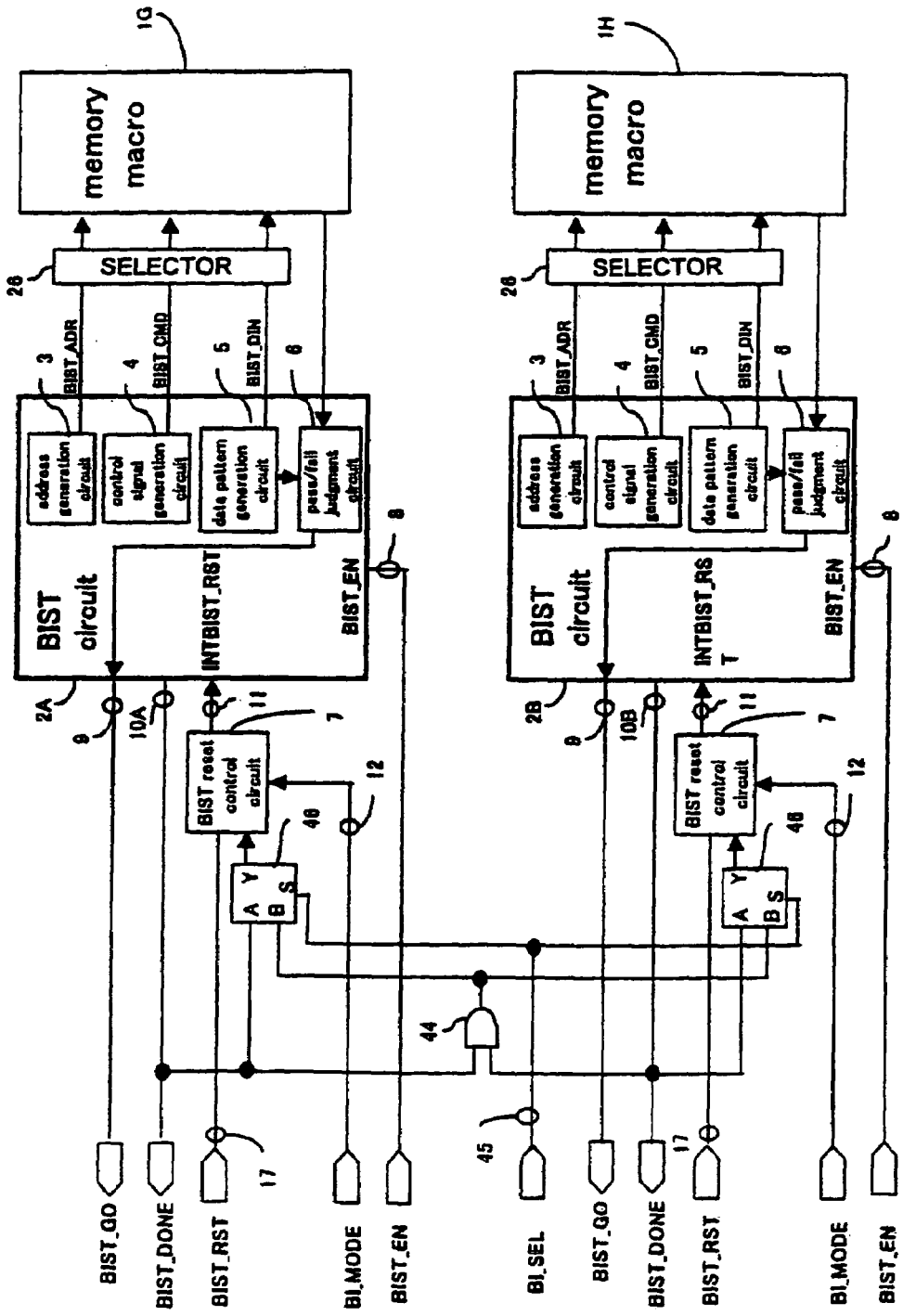
FIG. 8 is a block diagram showing an example of configuring a semiconductor integrated circuit device in accordance with a fourth embodiment of the present invention.

FIG. 8 is a block diagram of a semiconductor integrated circuit device in accordance with a fourth embodiment of the present invention. This semiconductor integrated circuit device has a configuration in which a plurality of memory macros (in the drawing, two memory macros 1G and 1H are shown) each having different memory configuration (the number of addresses, the number of data bits, memory types, or the like) and memory BIST circuits 2A and 2B which correspond to each memory macro are mounted. Incidentally, in FIG. 8, the same reference numerals are given to like components and signal lines of those in FIG. 1 and description thereof will be omitted.

In FIG. 8, reference numeral 44 represents an AND circuit which produces an "H" level when both of the memory BIST test completion signal (BIST_DONE signal) 10A of the memory BIST circuit 2A and the BIST_DONE signal 10B of the memory BIST circuit 2B are in an "H" level, reference numeral 46 represents a selector which selects either an output signal of the AND circuit 44 or a BIST_DONE signal 10 (10A, 10B) of each memory BIST circuit to transfer to the BIST reset control circuit 7, and reference numeral 45 represents a signal (BI_SEL signal) which switches burn-in operation modes by the selector 46.

Hereinafter, description will be made of the operation of the semiconductor integrated circuit device configured as above. Incidentally, in this embodiment, a configuration of the memory macro 1G, the selector 26, the memory BIST circuit 2A, and the BIST reset control circuit 7 portion corresponding thereto is basically similar to the configuration shown in FIG. 1, although there exist signal lines or the like which are not shown here, except that the burn-in test result monitor selection signal (BI_RESULT) 27 is not supplied to the BIST reset control circuit 7 as shown in FIG. 1, and an output of the selector 46 instead of the BIST_DONE signal 10 (10A) is supplied to the BIST reset control circuit 7. The BI_RESULT signal 27 is made in an "H" level during execution of the continuous test of the memory macro in the burn-in test, thereby making it possible to obtain the effect in first embodiment except that the pass/fail judgment of the memory macro becomes possible. The configuring of the memory macro 1H, the selector 26, the memory BIST circuit 2B, and the BIST reset control circuit 7 portion corresponding thereto, and the effect thereof are the same. Incidentally, in this embodiment, the BI_RESULT signal 27 is not supplied to the BIST reset control circuit 7, but the output of the selector 46 is supplied thereto, so that the BIST reset control circuit 7 can be configured such that, for example in the configuration in FIG. 2, the inverter circuit 32 and the AND circuit 33 are omitted, and the output signal of the selector 46 is supplied to the AND circuit 34. Hereinafter, description will be made mainly of the operation of the components which characterizes this embodiment and are different from those of the first embodiment, and also of the effect thereof.

In the burn-in test mode by the memory BIST circuit 2A and 2B (both of the BIST_EN signal 8 and the BI_MODE signal 12 are in an "H" level), when the BI_SEL signal 45 is in an "H" level, the output signal of the AND circuit 44 given by a logical product of the BIST_DONE signals 10A and 10B is selected by each selector 46 as a signal to each BIST reset control circuit 7.

Thus, since the memory macros 1G and 1H have different memory configurations, generation timings of the BIST_DONE signals 10A and 10B of each memory BIST circuit 2A and 2B are not the same, but the reset of the BIST circuit of each memory macro will not be performed until all tests by the memory BIST circuit 2A and 2B are completed.

Therefore, considering from a viewpoint of a stress time to memory cells, since dynamic stress to the memory cells becomes the same among respective memory macros, the burn-in test without the necessity of changing a burn-in applying time according to a memory capacity can be achieved by the memory BIST circuit even in a manufacture process where a stress degradation of the memory cell is dominant.

Next, when the BI_SEL signal 45 is in an "L" level, the BIST_DONE signals 10A and 10B of each of the memory BIST circuits 2A and 2B are selected by each selector 46. In this case, in response to a generation of the BIST_DONE signal 10 ("H" level) of each of the memory BIST circuits 2A and 2B, the corresponding BIST reset control circuit 7 generates the BIST reset signal 11, and the reset is performed for every each of the memory BIST circuit 2A and 2B. That is, each of the memory BIST circuits 2A and 2B is reset individually according to the BIST_DONE signals 10A and 10B that both produce, respectively, and is not dependent on the BIST_DONE signal of other memory BIST circuits.

Therefore, when transistor degradation of the logic section is a major factor in the burn-in test, the burn-in circuit where each memory macro operates continuously can be achieved.

Incidentally, a configuration in which the output signal of the AND circuit 44 instead of the output of the selector 46 is directly supplied to each BIST reset control circuit 7 without arranging each selector 46 and supplying the BI_SEL signal 45 either may also be possible.

What is claimed is:

1. A semiconductor integrated circuit device comprising:
a plurality of selectable memory sections comprising:
a first memory section having a minimum input/output data bit width of n bits (n a positive integer), and
a second memory section having a bit width of m bits (m a positive integer greater than n);
a data width expansion circuit that converts an n-bit data pattern to an m-bit data pattern;
a data width reduction circuit that converts an m-bit data pattern to an n-bit data pattern;
a memory self-test circuit that tests a selected one of the memory sections, the memory self-test circuit comprising:
an address generation circuit that generates an address of the memory sections, the generated address determining which of the memory sections is selected,
a data pattern generation circuit that generates a data pattern,
a control signal generation circuit that generates a memory control signal for controlling: (a) a data writing operation of writing first test data to the selected memory section at the generated address and (b) a data reading operation of reading the stored first test data from the selected memory section at the generated address,
a pass/fail judgment circuit that compares expected value data corresponding to the generated data pattern with second test data so as to determine that the selected memory section is non-defective when the compared data coincide and determine that the selected memory section is defective when the compared data do not coincide, and
a test completion judgment circuit that determines completion of the memory test; and
a reset circuit that resets the memory self-test circuit in response to a completion determination of the memory test by the test completion judgment circuit, wherein:
when the first memory section is selected:
the generated data pattern is stored in the selected memory section as the first test data, and
the stored first test data read from the selected memory section is supplied to the pass/fail judgment circuit as the second test data for comparison with the expected value data; and
when the second memory section is selected:
the data width expansion circuit converts the n-bit generated data pattern to an m-bit data pattern that is stored in the selected memory section as the first test data, and
the data width reduction circuit converts the stored m-bit first test data read from the selected memory section to an n-bit data pattern that is supplied to the pass/fail judgment circuit as the second test data for comparison with the expected value data.

2. A semiconductor integrated circuit device comprising:
a plurality of memory sections;
a plurality of memory self-test circuits that each tests a different corresponding one of the memory sections, each memory self-test circuit comprising:
an address generation circuit that generates an address of the corresponding memory section,
a data pattern generation circuit that generates a data pattern,
a control signal generation circuit that generates a memory control signal for controlling: (a) a data writing operation of writing the generated data pattern to the corresponding memory section at the generated address and (b) a data reading operation of reading the generated and stored data pattern from the corresponding memory section at the generated address,
a pass/fail judgment circuit that compares expected value data corresponding to the generated data pattern with the read data pattern so as to determine that the corresponding memory section is non-defective when the compared data coincide and determine that the corresponding memory section is defective when the compared data do not coincide, and a test completion judgment circuit that determines completion of the memory test for the corresponding memory section;

an all memory test completion detection circuit that produces a detection signal when all of the test completion judgment circuits determine the completion of their memory tests; and a plurality of reset circuits that each resets a corresponding one of the memory self-test circuits in response to the detection signal provided by the all memory test completion detection circuit.

3. A semiconductor integrated circuit device comprising:

a plurality of memory sections;

a plurality of memory self-test circuits that each tests a different corresponding one of the memory sections, each memory self-test circuit comprising:

an address generation circuit that generates an address of the corresponding memory section, a data pattern generation circuit that generates a data pattern, a control signal generation circuit that generates a memory control signal for controlling: (a) a data writing operation of writing the generated data pattern to the corresponding memory section at the generated address and (b) a data reading operation of reading the generated and stored data pattern from the corresponding memory section at the generated address, a pass/fail judgment circuit that compares expected value data corresponding to the generated data pattern with the read data pattern so as to determine that the corresponding memory section is non-defective when the compared data coincide and determine that the corresponding memory section is defective when the compared data do not coincide, and a test completion judgment circuit that indicates completion of the memory test for the corresponding memory section with a memory section test completion signal;

an all memory test completion detection circuit that produces a detection signal when all of the test completion judgment circuits determine the completion of their memory tests;

a plurality of reset circuits that each resets a corresponding one of the memory self-test circuits; and a switching circuit that provides as a reset signal to each of the reset circuits either: (a) the corresponding memory section test completion signal or (b) the detection signal provided by the all memory test completion detection circuit in accordance with an external control signal, wherein each reset circuit resets the corresponding memory self-test circuit in response to the reset signal provided by the switching circuit.

* * * * *